(12) United States Patent
Wan et al.

(10) Patent No.: US 7,447,086 B2
(45) Date of Patent: Nov. 4, 2008

(54) SELECTIVE PROGRAM VOLTAGE RAMP RATES IN NON-VOLATILE MEMORY

(75) Inventors: Jun Wan, Sunnyvale, CA (US); Jeffrey Lutze, San Jose, CA (US); Masaaki Higashitani, Cupertino, CA (US); Gerrit Jan Hemink, Yokohama (JP); Ken Oowada, Kanagawa (JP); Jian Chen, San Jose, CA (US); Geoffrey S Gongwer, Los Altos, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/866,261

(22) Filed: Oct. 2, 2007

(65) Prior Publication Data

US 2008/0019180 A1    Jan. 24, 2008

Related U.S. Application Data

(63) Continuation of application No. 11/127,743, filed on May 12, 2005, now Pat. No. 7,295,478.

(51) Int. Cl.
*G11C 7/00* (2006.01)
(52) U.S. Cl. .................. 365/195; 365/189.011
(58) Field of Classification Search .......... 365/195, 365/189.011
See application file for complete search history.

(56) References Cited

U.S. PATENT DOCUMENTS

| | | | |
|---|---|---|---|
| 4,933,904 A | 6/1990 | Stewart et al. | |
| 5,473,563 A | 12/1995 | Suh et al. | |
| 5,546,341 A | 8/1996 | Suh et al. | |
| 5,548,554 A | 8/1996 | Pascucci et al. | |
| 5,566,323 A | 10/1996 | Ugon | |
| 5,621,684 A | 4/1997 | Jung et al. | |
| 5,671,176 A | 9/1997 | Jang et al. | |
| 5,677,873 A | 10/1997 | Choi et al. | |
| 5,712,815 A | 1/1998 | Bill et al. | |
| 5,748,538 A | 5/1998 | Lee et al. | |

(Continued)

FOREIGN PATENT DOCUMENTS

EP    1341185    9/2003

OTHER PUBLICATIONS

International Search Report, Patent Cooperation Treaty, Application No. PCT/US2006/018278 filed on Nov. 5, 2006.

*Primary Examiner*—Richard Elms
*Assistant Examiner*—Nam Nguyen
(74) *Attorney, Agent, or Firm*—Vierra Magen Marcus & DeNiro LLP

(57) ABSTRACT

A non-volatile memory system is programmed so as to reduce or avoid program disturb. In accordance with one embodiment, multiple program inhibit schemes are employed for a single non-volatile memory system. Program inhibit schemes are selected based on the word line being programmed. Certain program inhibit schemes have been discovered to better minimize or eliminate program disturb at select word lines. In one embodiment, selecting a program inhibit scheme includes selecting a program voltage pulse ramp rate. Different ramp rates have been discovered to better minimize program disturb when applied to select word lines. In another embodiment, the temperature of a memory system is detected before or during a program operation. A program inhibit scheme can be selected based on the temperature of the system.

16 Claims, 11 Drawing Sheets

| | Program Voltage Pulse Ramp Rate | | |
|---|---|---|---|
| | method 1 | method 2 | method 3 |
| WL31 | PPR2 | | PPR32 |
| WL30 | PPR2 | PPR3 | PPR31 |
| ⋮ | ⋮ | ⋮ | ⋮ |
| WLm+1 | PPR2 | PPR3 | PPRm+1 |
| WLm | PPR2 | PPR3 | PPRm |
| ⋮ | ⋮ | ⋮ | ⋮ |
| WLn+1 | PPR2 | PPR2 | PPRn+1 |
| WLn | PPR2 | PPR2 | PPRn |
| ⋮ | ⋮ | ⋮ | ⋮ |
| WL2 | PPR1 | PPR1 | PPR3 |
| WL1 | PPR1 | PPR1 | PPR2 |
| WL0 | PPR1 | PPR1 | PPR1 |

U.S. PATENT DOCUMENTS

| | | |
|---|---|---|
| 5,763,912 A | 6/1998 | Parat et al. |
| 5,812,457 A | 9/1998 | Arase |
| 5,991,202 A | 11/1999 | Derhacobian et al. |
| 5,999,444 A | 12/1999 | Fujiwara et al. |
| 6,058,060 A | 5/2000 | Wong |
| 6,061,270 A | 5/2000 | Choi |
| 6,072,721 A | 6/2000 | Arase |
| 6,175,519 B1 | 1/2001 | Lu et al. |
| 6,181,599 B1 | 1/2001 | Gongwer |
| 6,229,733 B1 | 5/2001 | Male |
| 6,266,275 B1 | 7/2001 | Chen et al. |
| 6,269,026 B1 | 7/2001 | Venkatesh et al. |
| 6,285,593 B1 | 9/2001 | Wong |
| 6,411,551 B1 | 6/2002 | Kim et al. |
| 6,469,933 B2 | 10/2002 | Choi et al. |
| 6,567,314 B1 | 5/2003 | Ogura et al. |
| 6,639,842 B1 | 10/2003 | Hoang et al. |
| 6,717,861 B2 | 4/2004 | Jeong et al. |
| 6,788,579 B2 * | 9/2004 | Gregori et al. ......... 365/185.19 |
| 6,798,694 B2 | 9/2004 | Mihnea et al. |
| 6,804,150 B2 | 10/2004 | Park et al. |
| 6,853,598 B2 | 2/2005 | Chevallier |
| 6,859,392 B2 | 2/2005 | Abedifard et al. |
| 6,859,397 B2 | 2/2005 | Lutze et al. |
| 6,975,537 B2 | 12/2005 | Lutze et al. |
| 7,023,733 B2 | 4/2006 | Guterman et al. |
| 7,295,478 B2 | 11/2007 | Wan et al. |
| 2002/0131302 A1 | 9/2002 | Herdt |
| 2003/0147279 A1 | 8/2003 | Pan et al. |
| 2004/0080980 A1 | 4/2004 | Lee |
| 2004/0233716 A1 | 11/2004 | Tran et al. |
| 2005/0057967 A1 | 3/2005 | Kalid et al. |
| 2005/0226055 A1 | 10/2005 | Guterman |

* cited by examiner

|  | Program Inhibit Scheme | | |
|---|---|---|---|
|  | method 1 | method 2 | method 3 |
| WL31 | PIS2 | PIS3 | PIS32 |
| WL30 | PIS2 | PIS3 | PIS31 |
| ⋮ | ⋮ | ⋮ | ⋮ |
| WLm+1 | PIS2 | PIS3 | PISm+1 |
| WLm | PIS2 | PIS3 | PISm |
| ⋮ | ⋮ | ⋮ | ⋮ |
| WLn+1 | PIS2 | PIS2 | PISn+1 |
| WLn | PIS2 | PIS2 | PISn |
| ⋮ | ⋮ | ⋮ | ⋮ |
| WL2 | PIS1 | PIS1 | PIS3 |
| WL1 | PIS1 | PIS1 | PIS2 |
| WL0 | PIS1 | PIS1 | PIS1 |

Fig. 16

|  | Program Voltage Pulse Ramp Rate | | |
|---|---|---|---|
|  | method 1 | method 2 | method 3 |
| WL31 | PPR2 |  | PPR32 |
| WL30 | PPR2 | PPR3 | PPR31 |
| ⋮ | ⋮ | ⋮ | ⋮ |
| WLm+1 | PPR2 | PPR3 | PPRm+1 |
| WLm | PPR2 | PPR3 | PPRm |
| ⋮ | ⋮ | ⋮ | ⋮ |
| WLn+1 | PPR2 | PPR2 | PPRn+1 |
| WLn | PPR2 | PPR2 | PPRn |
| ⋮ | ⋮ | ⋮ | ⋮ |
| WL2 | PPR1 | PPR1 | PPR3 |
| WL1 | PPR1 | PPR1 | PPR2 |
| WL0 | PPR1 | PPR1 | PPR1 |

Fig. 18

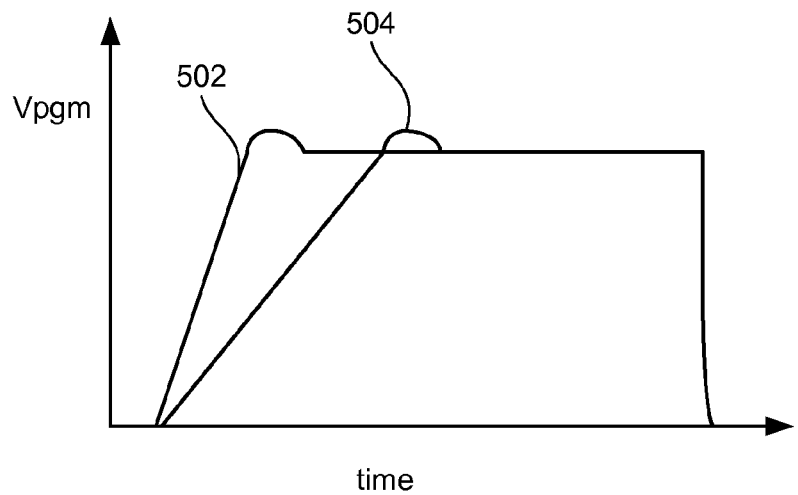

Fig. 17

SELECTIVE PROGRAM VOLTAGE RAMP RATES IN NON-VOLATILE MEMORY

CLAIM OF PRIORITY

This application is a continuation application of U.S. patent application Ser. No. 11/127,743, entitled "SELECTIVE APPLICATION OF PROGRAM INHIBIT SCHEMES IN NON-VOLATILE MEMORY," filed May 12, 2005, now U.S. Pat. No. 7,295,478, which is incorporated herein by reference in its entirety.

BACKGROUND OF THE INVENTION

1. Field of the Invention

The present invention relates generally to technology for programming non-volatile memory devices.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM), including flash EEPROM, and Electrically Programmable Read Only Memory (EPROM) are among the most popular non-volatile semiconductor memories.

One example of a flash memory system uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first select gate 120 and a second select gate 122. Select gate 120 connects the NAND string to a bit line through bit line terminal 126. Select gate 122 connects the NAND string to a source line through source line terminal 128. Select gate 120 is controlled by applying appropriate voltages to control gate 120CG for select gate 120. Select gate 122 is controlled by applying the appropriate voltages to control gate 122CG of select gate 122. Each of the transistors 100, 102, 104 and 106 includes a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

FIG. 3 provides a cross-sectional view of the NAND string described above. As depicted in FIG. 3, the transistors (also called cells or memory cells) of the NAND string are formed in p-well region 140. Each transistor includes a stacked gate structure that consists of the control gate (100CG, 102CG, 104CG and 106CG) and a floating gate (100FG, 102FG, 104FG and 106FG). The floating gates are formed on the surface of the p-well on top of an oxide or other dielectric composite film. The control gate is above the floating gate, with an oxide or other isolating dielectric layer separating the control gate and floating gate. Note that FIG. 3 appears to depict a control gate and floating gate for transistors 120 and 122. However, for transistors 120 and 122, the control gate and the floating gate are electrically connected together. The control gates of the memory cells (100, 102, 104, 106) form the word lines. N+ doped layers 130, 132, 134, 136 and 138 are shared between neighboring cells whereby the cells are connected to one another in series to form a NAND string. These N+ doped layers form the source and drain of each of the cells. For example, N+ doped layer 130 serves as the drain of transistor 122 and the source for transistor of 106, N+ doped layer 132 serves as the drain for transistor 106 and the source for transistor 104, N+ doped region 134 serves as the drain for transistor 104 and the source for transistor 102, N+ doped region 136 serves as the drain for transistor 102 and the source for transistor 100, and N+ doped layer 138 serves as the drain for transistor 100 and the source for transistor 120. N+ doped layer 126 connects to the bit line for the NAND string, while N+ doped layer 128 connects to a common source line for multiple NAND strings.

Note that although FIGS. 1-3 show four memory cells in the NAND string, the use of four transistors is only provided as an example. A NAND string can have less than four memory cells or more than four memory cells. For example, some NAND strings will include eight memory cells, 16 memory cells, 32 memory cells, etc. The discussion herein is not limited to any particular number of memory cells in a NAND string.

A typical architecture for a flash memory system using a NAND structure will include several NAND strings. For example, FIG. 4 shows three NAND strings 202, 204 and 206 of a memory array having many more NAND strings. Each of the NAND strings of FIG. 4 includes two select transistors and four memory cells. For example, NAND string 202 includes select transistors 220 and 230, and memory cells 222, 224, 226 and 228. NAND string 204 includes select transistors 240 and 250, and memory cells 242, 244, 246 and 248. Each string is connected to the source line by its select transistor (e.g. select transistor 230 and select transistor 250). A selection line SGS is used to control the source side select gates. The various NAND strings are connected to respective bit lines by select transistors 220, 240, etc., which are controlled by select line SGD. In other embodiments, the select lines do not necessarily need to be in common. Word line WL3 is connected to the control gates for memory cell 222 and memory cell 242. Word line WL2 is connected to the control gates for memory cell 224 and memory cell 244. Word line WL1 is connected to the control gates for memory cell 226 and memory cell 246. Word line WL0 is connected to the control gates for memory cell 228 and memory cell 248. As can be seen, each bit line and the respective NAND string comprise the columns of the array of memory cells. The word lines (WL3, WL2, WL1 and WL0) comprise the rows of the array. Each word line connects the control gates of each memory cell in the row. For example, word line WL2 is connected to the control gates for memory cells 224, 244 and 252.

Each memory cell can store data (analog or digital). When storing one bit of digital data, the range of possible threshold voltages of the memory cell is divided into two ranges which are assigned logical data "1" and "0." In one example of a NAND type flash memory, the threshold voltage is negative after the memory cell is erased, and defined as logic "1." The threshold voltage after a program operation is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored. A memory cell can also store multiple levels of information, for example, multiple bits of digital data. In the case of storing multiple levels of data, the range of possible threshold voltages is divided into the number of levels of data. For example, if four levels of information are stored, there will be four threshold voltage ranges assigned to the data values "11", "10", "01", and "00." In one example of a NAND type memory, the threshold voltage after an erase operation is negative and defined as "11." Positive threshold voltages are used for the states of "10", "01", and "00."

Relevant examples of NAND type flash memories and their operation are provided in the following U.S. patents/patent applications, all of which are incorporated herein by reference: U.S. Pat. Nos. 5,570,315; 5,774,397, 6,046,935, 6,456,528 and U.S. patent application. Ser. No. 09/893,277 (Publication No. US2003/0002348).

When programming a flash memory cell, a program voltage is applied to the control gate and the bit line is grounded. Electrons from the p-well are injected into the floating gate. When electrons accumulate in the floating gate, the floating gate becomes negatively charged and the threshold voltage of the cell is raised. To apply the program voltage to the control gate of the cell being programmed, that program voltage is applied on the appropriate word line. As discussed above, that word line is also connected to one cell in each of the other NAND strings that utilize the same word line. For example, when programming cell 224 of FIG. 4, the program voltage will also be applied to the control gate of cell 244 because both cells share the same word line. A problem arises when it's desired to program one cell on a word line without programming other cells connected to the same word line, for example, when it's desired to program cell 224 and not cell 244. Because the program voltage is applied to all cells connected to a word line, an unselected cell (a cell that is not to be programmed) connected to the word line, especially a cell adjacent to the cell selected for programming, may become inadvertently programmed. For example, cell 244 is adjacent to cell 224. When programming cell 224, there is a concern that cell 244 might unintentionally be programmed. The unintentional programming of the unselected cell on the selected word line is referred to as "program disturb."

Several techniques can be employed to prevent program disturb. In one method known as "self boosting," the unselected bit lines are electrically isolated and a pass voltage (e.g. 10 volts) is applied to the unselected word lines during programming. The unselected word lines couple to the channel and source/drain regions of the NAND strings corresponding to the unselected bit lines, causing a voltage (e.g. eight volts) to be impressed in the channel and source/drain regions of the unselected bit lines, thereby preventing program disturb. Self boosting causes a voltage boost to exist in the channel which lowers the voltage across the tunnel oxide and hence prevents program disturb.

Local Self Boosting ("LSB") and Erased Area Self Boosting ("EASB") both attempt to isolate the channel of previously programmed cells from the channel of the cell being inhibited to maintain a high voltage in the boosted channel. For example, if cell 224 of FIG. 4 is being programmed, LSB and EASB attempt to inhibit programming in cell 244 by isolating the channel of cell 244 from the previously programmed cells (246 and 248). Variations of these boosting techniques can also be employed.

Despite the use of one of these techniques for programming a non-volatile memory, program disturb can still occur. Thus, there is a need for a better mechanism to prevent program disturb.

SUMMARY OF THE INVENTION

A non-volatile memory system is programmed so as to reduce or avoid program disturb. In accordance with one embodiment, multiple program inhibit schemes are employed for a single non-volatile memory system. Program inhibit schemes are selected based on the word line being programmed. Certain program inhibit schemes have been discovered to better minimize or eliminate program disturb at select word lines. In one embodiment, selecting a program inhibit includes selecting a program voltage pulse ramp rate. Different ramp rates have been discovered to better minimize program disturb when applied to select word lines. In another embodiment, the temperature of a memory system is detected before or during a program operation. A program inhibit scheme can be selected based on the temperature of the system.

In one embodiment, a method of programming non-volatile storage is provided that comprises determining which of a plurality of word lines is to receive a program voltage signal for programming. The selected word line is coupled to a first non-volatile storage element of a first group of non-volatile storage elements and a second non-volatile storage element of a second group of non-volatile storage elements. The first non-volatile storage element is to be inhibited from programming and the second non-volatile storage element is to be programmed. A program inhibit scheme is selected based on the word line that is to receive the program voltage signal. The channel of the first group is boosted to a voltage potential using the selected program inhibit scheme. After boosting the channel of the first group, programming of the second group of non-volatile storage elements is enabled.

In another embodiment, a method of programming non-volatile storage is provided that comprises determining a temperature of the non-volatile storage. The non-volatile storage includes a first group of non-volatile storage elements to be inhibited from programming and a second group of non-volatile storage elements to be enabled for programming. A program inhibit scheme is selected based on the temperature. The channel of the first group of non-volatile storage elements is boosted using the selected program inhibit scheme and programming of the second group of non-volatile storage elements is enabled.

In yet another embodiment, a non-volatile memory system is provided that comprises a plurality of word lines, a first group of non-volatile storage elements having a first non-volatile storage element to be inhibited from programming and a second group of non-volatile storage elements having a second non-volatile storage element to be programmed. Managing circuitry in communication with the plurality of word lines and the first and second groups of non-volatile storage elements is provided. The managing circuitry programs the second non-volatile storage element by determining which word line of the plurality of word lines is also coupled to the second non-volatile storage element. That word line is a first word line which is coupled to the first non-volatile storage element. The managing circuitry selects a program inhibit scheme based on the first word line selected for programming. A voltage potential of a channel of the first group of non-volatile storage elements is boosted using the selected program inhibit scheme and programming of the second group of non-volatile storage elements is enabled.

In another embodiment, a method of programming non-volatile storage is provided that comprises programming one or more non-volatile storage elements coupled to a first word line. Programming the first word line includes boosting a voltage potential of a channel of a first group of non-volatile storage elements having a first non-volatile storage element to be inhibited from programming. The first non-volatile storage element is coupled to the first word line. Boosting is accomplished according to a first program inhibit scheme and programming of a second group of non-volatile storage elements having a second non-volatile storage element to be programmed is enabled. The second non-volatile storage element is coupled to the first word line. The method also comprises programming one or more non-volatile storage elements coupled to a second word line by boosting a voltage potential of the channel of the first group of non-volatile storage elements having a third non-volatile storage element to be inhibited from programming. The third non-volatile storage element is coupled to the second word line. The boosting is accomplished according to a second program inhibit scheme and programming of the second group of non-volatile storage elements having a fourth non-volatile storage element to be programmed is enabled. The fourth non-volatile storage element is coupled to the second word line.

Other features, aspects, and objects of the invention can be obtained from a review of the specification, the figures, and the claims.

BRIEF DESCRIPTION OF THE DRAWINGS

FIG. 16 is a table depicting exemplary methods for utilizing different program inhibit schemes in accordance with one embodiment.

FIG. 17 is a graph depicting the slope of various program voltage pulses in accordance with one embodiment.

FIG. 18 is a table depicting exemplary methods for utilizing different program voltage pulse ramp rates in accordance with one embodiment.

DETAILED DESCRIPTION

Figure 5:
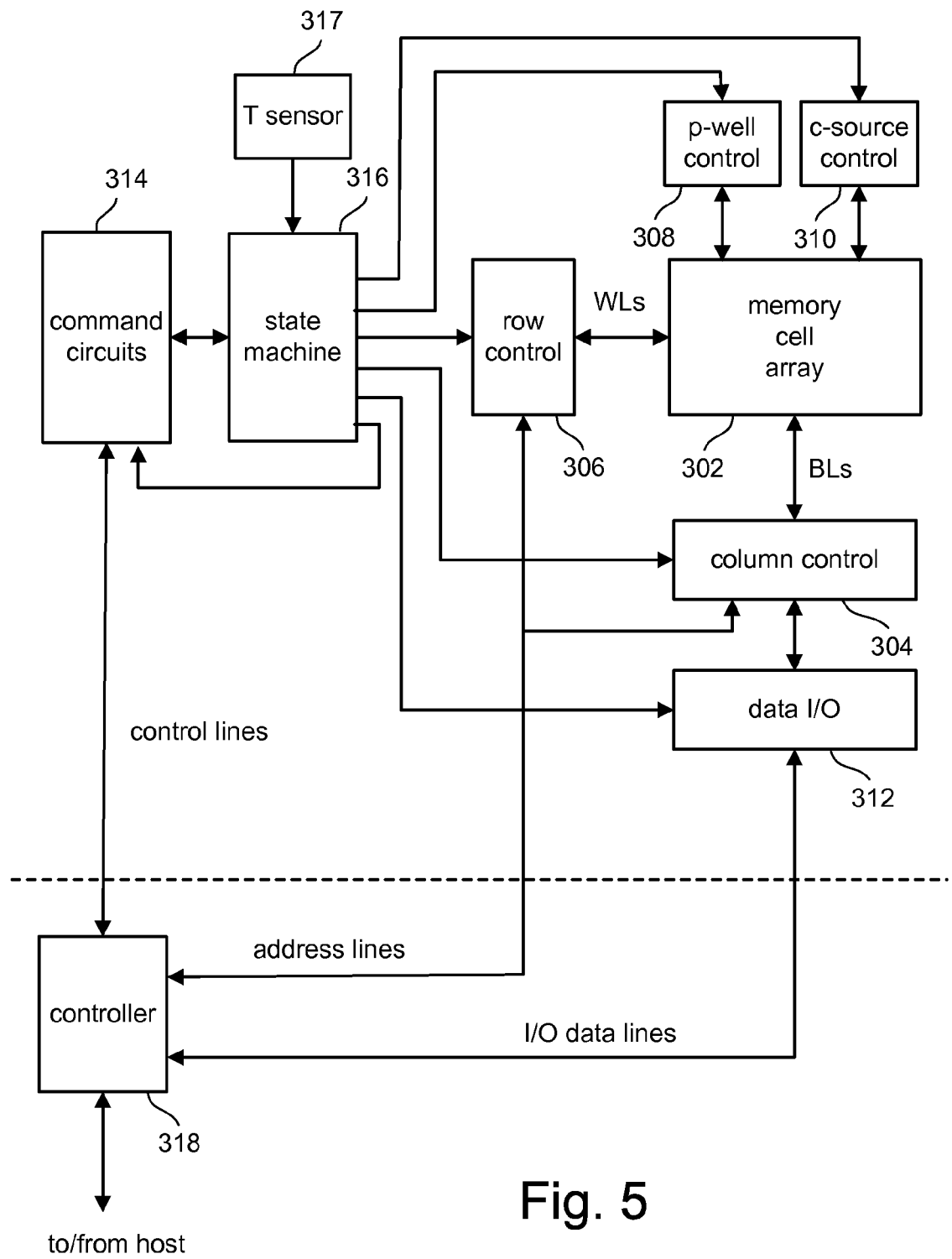
FIG. 5 is a block diagram of one embodiment of a non-volatile memory system in which the various aspects of the present invention can be implemented.

FIG. 5 is a block diagram of one embodiment of a flash memory system that can be used to implement the present invention. Memory cell array 302 is controlled by column control circuit 304, row control circuit 306, c-source control circuit 310 and p-well control circuit 308. Column control circuit 304 is connected to the bit lines of memory cell array 302 for reading data stored in the memory cells, for determining a state of the memory cells during a program operation, and for controlling potential levels of the bit lines to promote or inhibit programming and erasing. Row control circuit 306 is connected to the word lines to select one of the word lines, to apply read voltages, to apply program voltages combined with the bit line potential levels controlled by column control circuit 304, and to apply an erase voltage. C-source control circuit 310 controls a common source line (labeled as "C-source" in FIG. 6) connected to the memory cells. P-well control circuit 308 controls the p-well voltage.

The data stored in the memory cells are read out by the column control circuit 304 and are output to external I/O lines via data input/output buffer 312. Program data to be stored in the memory cells are input to the data input/output buffer 312 via the external I/O lines, and transferred to the column control circuit 304. The external I/O lines are connected to controller 318.

Command data for controlling the flash memory device are input to controller 318. The command data informs the flash memory of what operation is requested. The input command is transferred to state machine 316 that controls column control circuit 304, row control circuit 306, c-source control 310, p-well control circuit 308 and data input/output buffer 312. State machine 316 can also output status data of the flash memory such as READY/BUSY or PASS/FAIL.

Controller 318 is connected to or connectable with a host system such as a personal computer, a digital camera, or personal digital assistant, etc. It communicates with the host that initiates commands, such as to store or read data to or from the memory array 302, and provides or receives such data. Controller 318 converts such commands into command signals that can be interpreted and executed by command circuits 314, which is in communication with state machine 316. Controller 318 typically contains buffer memory for the user data being written to or read from the memory array.

One exemplary memory system comprises one integrated circuit that includes controller 318, and one or more integrated circuit chips that each contain a memory array and associated control, input/output and state machine circuits. There is a trend to integrate the memory arrays and controller circuits of a system together on one or more integrated circuit chips. The memory system may be embedded as part of the host system, or may be included in a memory card (or other package) that is removably inserted into the host systems. Such a card may include the entire memory system (e.g. including the controller) or just the memory array(s) with associated peripheral circuits (with the Controller or control function being embedded in the host). Thus, the controller can be embedded in the host or included within the removable memory system.

Figure 6:
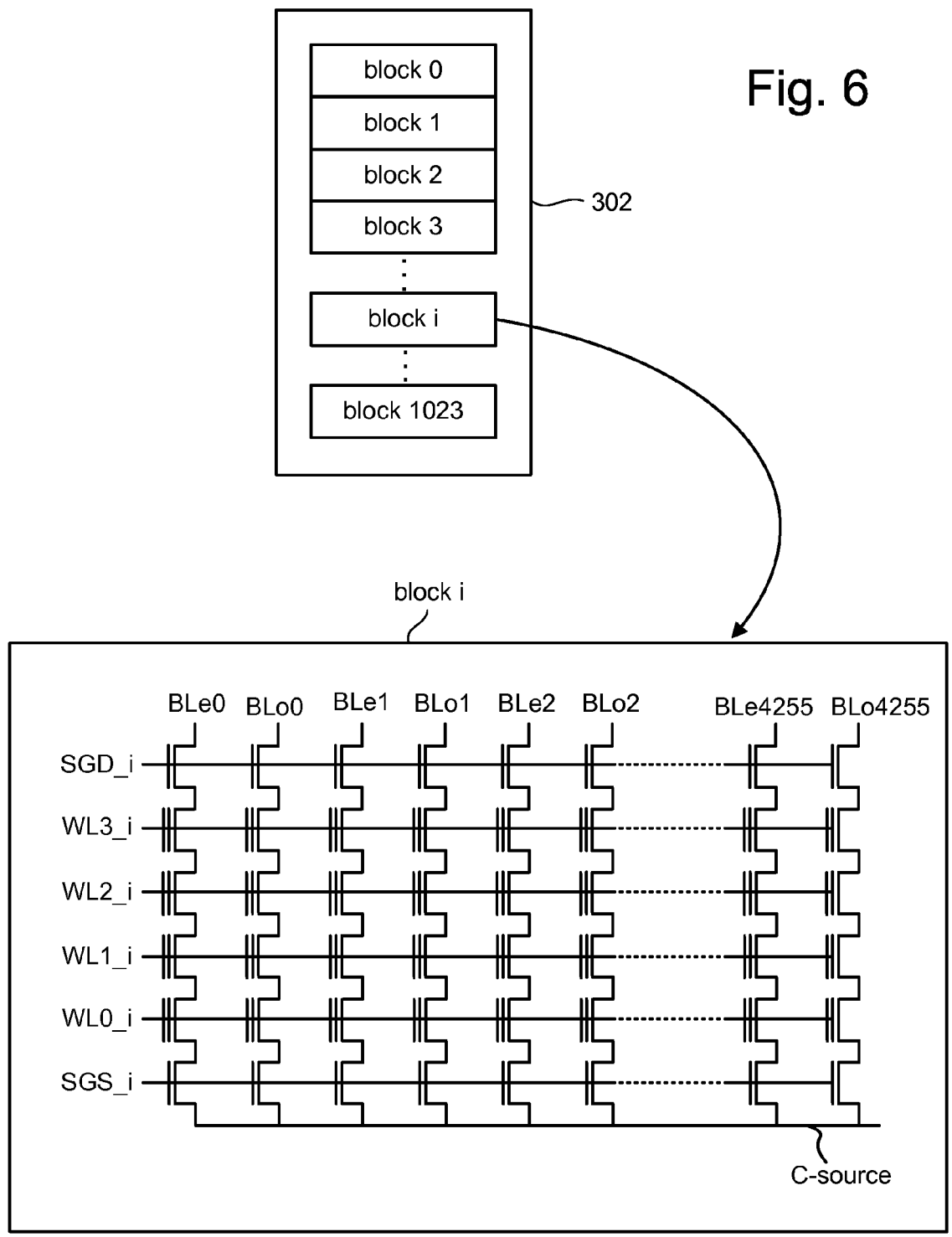
FIG. 6 illustrates an exemplary organization of a memory array.

With reference to FIG. 6, an exemplary structure of memory cell array 302 is described. As one example, a NAND flash EEPROM is described that is partitioned into 1,024 blocks. The data stored in each block is simultaneously erased. In one embodiment, the block is the minimum unit of cells that are simultaneously erased. In each block, in this example, there are 8,512 columns that are divided into even columns and odd columns. The bit lines are also divided into even bit lines (BLe) and odd bit lines (BLo). FIG. 6 shows four memory cells connected in series to form a NAND string. Although four cells are shown to be included in each NAND string, more or less than four can be used (e.g., 16, 32, or another number). One terminal of the NAND string is connected to a corresponding bit line via a first select transistor SGD, and another terminal is connected to c-source via a second select transistor SGS.

During read and programming operations of one embodiment, 4,256 memory cells are simultaneously selected. The memory cells selected have the same word line (e.g. WL2-i), and the same kind of bit line (e.g. even bit lines). Therefore, 532 bytes of data can be read or programmed simultaneously. These 532 bytes of data that are simultaneously read or programmed form a logical page. Therefore, in this example, one block can store at least eight pages. When each memory cell stores two bits of data (e.g. a multi-level cell), one block stores 16 pages.

Other architectures can also be used in accordance with embodiments. One embodiment utilizes the all bit line architecture whereby the bit lines are not divided into even and odd columns. In such embodiments, each bit line in a block is simultaneously selected during read and program operations. Memory cells along a common word line and connected to any bit line are programmed at the same time.

Examples of an architecture using odd/even bit line programming can be found in U.S. Pat. Nos. 6,522,580 and 6,643,188; both of which are incorporated herein by reference in their entirety. More information about an architecture that uses all bit line programming can be found in the following U.S. patent documents incorporated by reference in their entirety: United States Patent Application Publication US 2004/0057283; United States Patent Application Publication US 2004/0060031; United States Patent Application Publication US 2004/0057285; United States Patent Application Publication US 2004/0057287; United States Patent Application Publication US 2004/0057318; United States Patent Application Publication US 2003/0161182; United States Patent Application Publication US 2004/0047182. Additionally, U.S. patent application Ser. No. 11/099,133, entitled "COMPENSATING FOR FLOATING GATE COUPLING DURING READ OPERATIONS," filed Apr. 5, 2005, incorporated by reference in its entirety, describes examples of full sequence and two-pass programming for both all bit line and odd/even bit line programming architectures.

Memory cells are erased in one embodiment by raising the p-well to an erase voltage (e.g. 20 volts) and grounding the word lines of a selected block while the source and bit lines are floating. Due to capacitive coupling, the unselected word lines (e.g., those in unselected, not to-be-erased blocks), bit lines, select lines, and c-source are also raised to a high positive potential (e.g., 20V). A strong electric field is thus applied to the tunnel oxide layers of memory cells of a selected block and the data of the selected memory cells are erased as electrons of the floating gates are emitted to the substrate. As sufficient electrons are transferred from the floating gate to the p-well region, the threshold voltage of a selected cell becomes negative. Erasing can be performed on the entire memory array, multiple blocks of the array, or another unit of cells.

In the read and verify operations, the select gates (SGD and SGS) of a selected block are raised to one or more select voltages and the unselected word lines (e.g., WL0, WL1 and WL3) of the selected block are raised to a read pass voltage (e.g. 4.5 volts) to make the transistors operate as pass gates. The selected word line of the selected block (e.g. WL2) is connected to a reference voltage, a level of which is specified for each read and verify operation in order to determine whether a threshold voltage of the concerned memory cell is above or below such level. For example, in a read operation of a one bit memory cell, the selected word line WL2 is grounded, so that it is detected whether the threshold voltage is higher than 0V. In a verify operation of a one bit memory cell, the selected word line WL2 is connected to 0.8V, for example, so that as programming progresses it is verified whether or not the threshold voltage has reached 0.8V. The source and p-well are at zero volts during read and verify. The selected bit lines (BLe) are pre-charged to a level of, for example, 0.7V. If the threshold voltage is higher than the read or verify level, the potential level of the concerned bit line (BLe) maintains the high level, because of the associated non-conductive memory cell. On the other hand, if the threshold voltage is lower than the read or verify level, the potential level of the concerned bit line (BLe) decreases to a low level, for example less than 0.5V, because of the conductive memory cell. The state of the memory cell is detected by a sense amplifier that is connected to the bit line and senses the resulting bit line voltage. The difference between whether the memory cell is programmed or erased depends on whether or not net negative charge is stored in the floating gate. For example, if negative charge is stored in the floating gate, the threshold voltage becomes higher and the transistor can be in enhancement mode of operation.

The erase, read and verify operations described above are performed according to techniques known in the art. Thus, many of the details explained can be varied by one skilled in the art.

When programming a memory cell in one example, the drain and the p-well receive 0 volts while the control gate receives a series of programming pulses with increasing magnitudes. In one embodiment, the magnitudes of the pulses in the series range from 15 volts to 25 volts. In other embodiments, the range of pulses in the series can be different, for example, having a starting level of 12 volts. During programming of memory cells, verify operations are carried out in the periods between the programming pulses. That is, the programming level of each cell of a group of cells being programmed in parallel is read between each programming pulse to determine whether or not it has reached or exceeded a verify level to which it is being programmed. One means of verifying the programming is to test conduction at a specific compare point. The cells that are verified to be sufficiently programmed are locked out, for example in NAND cells, by raising the bit line voltage from 0 to Vdd (e.g., 2.5 volts) for all subsequent programming pulses to terminate the programming process for those cells. In some cases, the number of pulses will be limited (e.g. 20 pulses) and if a given memory cell is not sufficiently programmed by the last pulse, an error is assumed. In some implementations, memory cells are erased (in blocks or other units) prior to programming.

Figure 7:
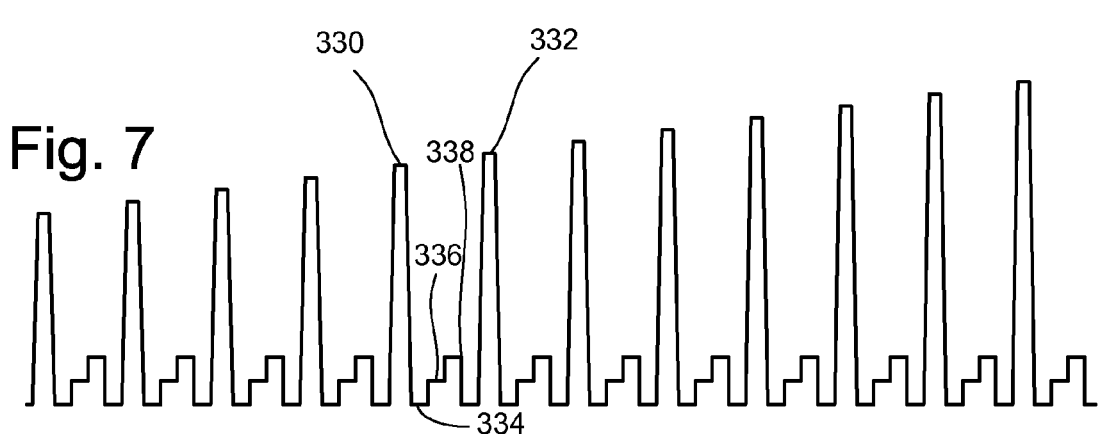
FIG. 7 depicts an exemplary program/verify voltage signal that can be applied to a selected word line in accordance with embodiments.

FIG. 7 depicts a program voltage signal in accordance with one embodiment. This signal has a set of pulses with increasing magnitudes. The magnitude of the pulses is increased with each pulse by a predetermined step size. In one embodiment that includes the memory cells storing multiple bits of data, an exemplary step size is 0.2 volts. Between each of the program pulses are the verify pulses. The signal of FIG. 7 assumes a four state memory cell, therefore, it includes three verify pulses. For example, between programming pulses 330 and 332 are three sequential verify pulses. The first verify pulse 334 is depicted at a zero volt verify voltage level. The second verify pulse 336 follows the first verify pulse at the second verify voltage level. The third verify pulse 338 follows the second verify pulse 336 at the third verify voltage level. A multi-state memory cell capable of storing data in eight states may need to perform verify operations for seven compare points. Thus, seven verify pulses are applied in sequence to perform seven verify operations at seven verify levels between two consecutive programming pulses. Based on the seven verify operations, the system can determine the state of the memory cells. One means for reducing the time burden of verifying is to use a more efficient verify process, for example, as disclosed in U.S. patent application Ser. No. 10/314,055, entitled "Smart Verify for Multi-State Memories," filed Dec. 5, 2002, incorporated herein by reference in its entirety.

Figure 8:
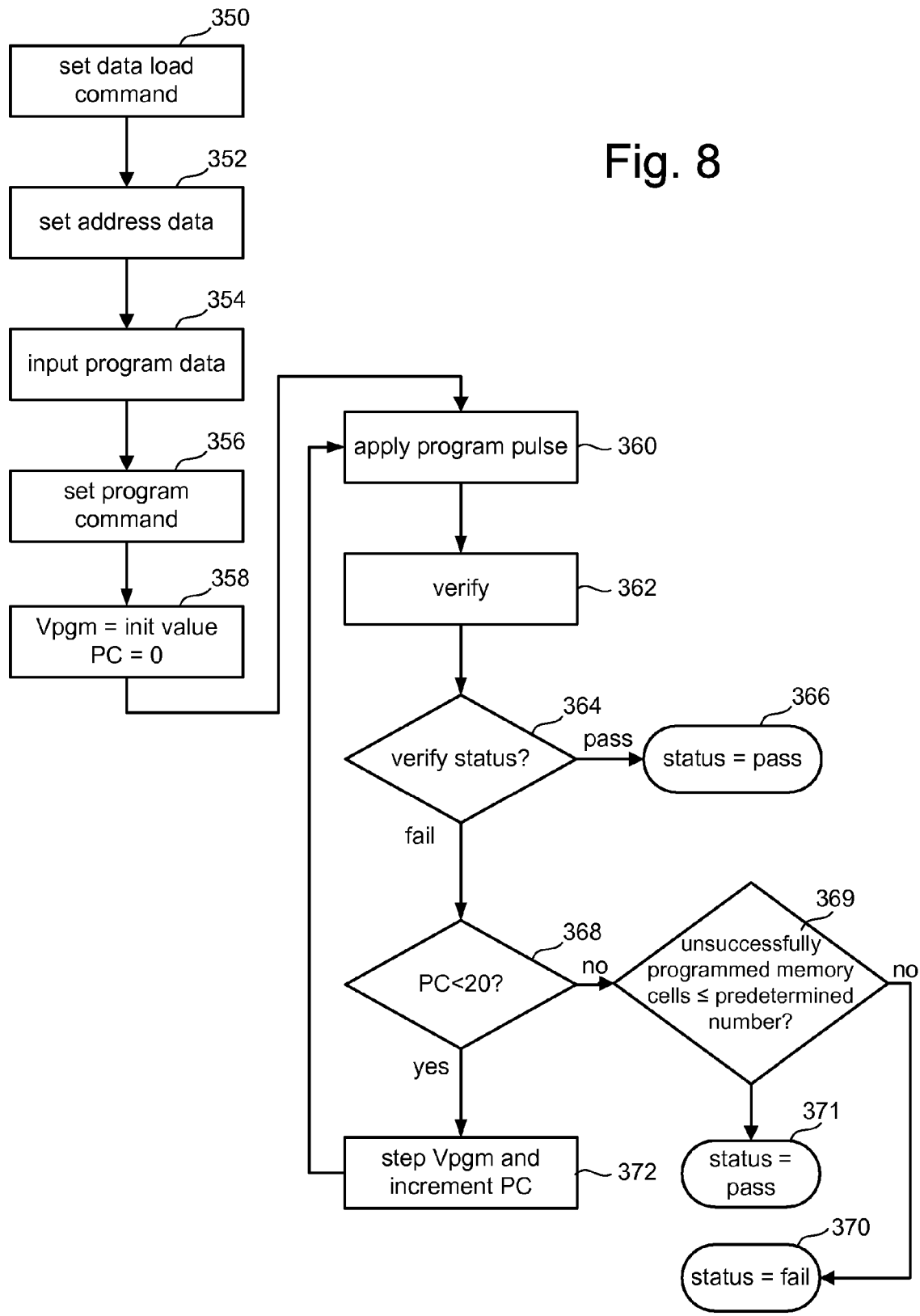
FIG. 8 is an exemplary flowchart for performing a program operation in accordance with one embodiment.

FIG. 8 is a flow chart describing a method for programming a non-volatile memory system. As will be apparent to those of ordinary skill in the art, various steps can be modified, added, or removed depending on a specific application or implementation while still remaining within the scope and spirit of the present disclosure. In various implementations, memory cells are erased (in blocks or other units) prior to programming. At step 350 of FIG. 8 (and in reference to FIG. 5), a data load command is issued by controller 318 and input to command circuit 314, allowing data to be input to data input/output buffer 312. The input data is recognized as a command and latched by state machine 316 via a command latch signal, not illustrated, input to command circuits 314. In step 352, address data designating the page address is input to row controller 306 from controller 318. The input data is recognized as the page address and latched via state machine 316, effected by the address latch signal input to command circuits 314. At step 354, 532 bytes of program data are input to data input/output buffer 312. It should be noted that 532 bytes of program data are specific to the particular implementation described, and other implementations will require or utilize various other sizes of program data. That data can be latched in a register for the selected bit lines. In some embodiments, the data is also latched in a second register for the selected bit lines to be used for verify operations. At step 356, a program command is issued by controller 318 and input to data input/output buffer 312. The command is latched by state machine 316 via the command latch signal input to command circuits 314.

At step 358, Vpgm, the programming pulse voltage level applied to the selected word line, is initialized to the starting pulse (e.g. 15 volts), and a program counter PC maintained by state machine 316, is initialized at 0. At step 360, a program voltage (Vpgm) pulse is applied to the selected word line, for example WL2 of FIG. 4. The bit lines that include a memory cell to be programmed are grounded to enable programming, while the other bit lines are connected to Vdd to inhibit programming during application of the programming pulse. More details of step 360, including various boosting and programming inhibit systems and techniques will be provided below.

At step 362, the states of the selected memory cells are verified. If it is detected that the target threshold voltage of a selected cell has reached the appropriate level (for example, the programmed level for logic 0 or a particular state of a multi-state cell), then the selected cell is verified as programmed to its target state. If it is detected that the threshold voltage has not reached the appropriate level, the selected cell is not verified as programmed to its target state. Those cells verified as programmed to their target state at step 362 will be excluded from further programming. At step 364, it is determined whether all cells to be programmed have been verified to have programmed to their corresponding states, such as by checking an appropriate data storage register designed to detect and signal such a status. If so, the programming process is complete and successful because all selected memory cells were programmed and verified to their target states. A status of pass is reported in step 366. If at step 364, it is determined that not all of the memory cells have been so verified, then the programming process continues. At step 368, the program counter PC is checked against a program limit value. One example of a program limit value is 20. If the program counter PC is not less than 20, then it is determined at step 369 whether the number of memory cells that have not been successfully programmed is equal to or less than a predetermined number. If the number of unsuccessfully programmed memory cells is equal to or less than the predetermined number, then the programming process is flagged as passed and a status of pass is reported at step 371. The memory cells that are not successfully programmed can be corrected using error correction during the read process. If however, the number of unsuccessfully programmed memory cells is greater than the predetermined number, the program process is flagged as failed and a status of fail is reported at step 370. If the program counter PC is less than 20, then the Vpgm level is increased by the step size and the program counter PC is incremented in step 372. After step 372, the process loops back to step 360 to apply the next Vpgm pulse.

The flowchart of FIG. 8 depicts a single-pass programming method as can be applied for binary storage. In a two-pass programming method as can be applied for multi-level storage, and as hereinafter described, for example, multiple programming or verification steps may be used in a single iteration of the flowchart. Steps 360-372 may be performed for each pass of the programming operation. In a first pass, one or more program pulses may be applied and the results thereof verified to determine if a cell is in the appropriate intermediate state. In a second pass, one or more program pulses may be applied and the results thereof verified to determine if the cell is in the appropriate final state.

Figure 9:
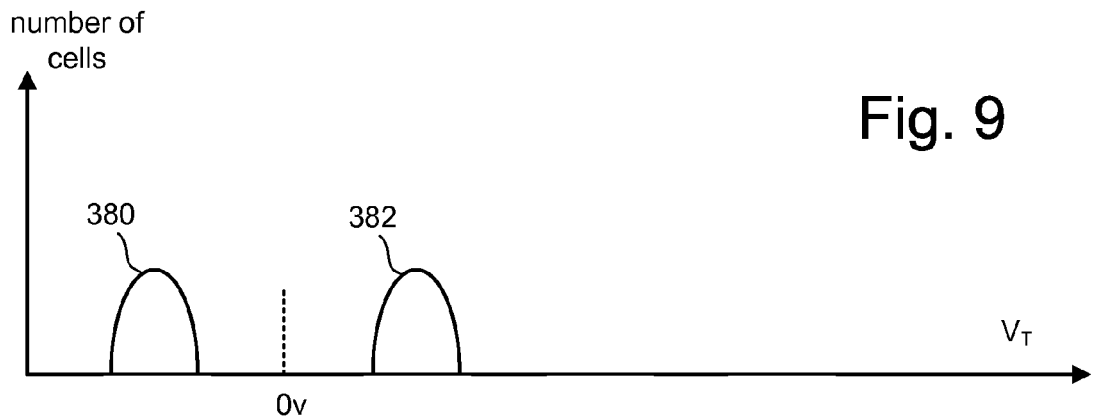
FIG. 9 depicts exemplary threshold distributions of a group of memory cells programmed to two states.

At the end of a successful program process, the threshold voltages of the memory cells should be within one or more distributions of threshold voltages for programmed memory cells or within a distribution of threshold voltages for erased memory cells. FIG. 9 illustrates threshold voltage distributions for the memory cell array when each memory cell stores one bit of data. FIG. 9 shows a first distribution 380 of threshold voltages for erased memory cells and a second distribution 382 of threshold voltages for programmed memory cells. In one embodiment, the threshold voltage levels in the first distribution are negative and the threshold voltage levels in the second distribution are positive.

Figure 10:
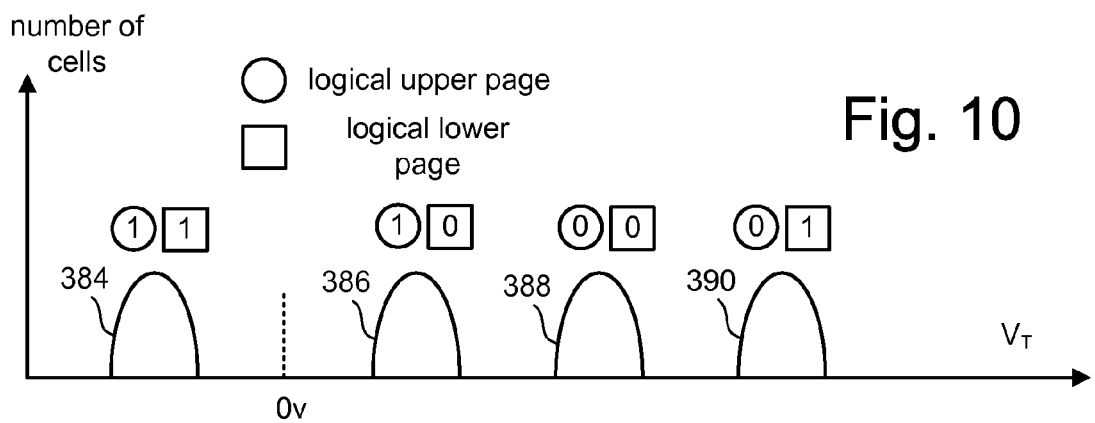
FIG. 10 depicts exemplary threshold distributions of a group of memory cells programmed to four states.

FIG. 10 illustrates exemplary threshold voltage distributions for a memory cell array when each memory cell stores two bits of data in four physical states. Distribution 384 represents a distribution of threshold voltages of cells that are in an erased state (storing "11"), having negative threshold voltage levels. Distribution 386 represents a distribution of threshold voltages of cells that are in a first programmed state, storing "10." Distribution 388 represents a distribution of threshold voltages of cells that are in a second programmed state, storing "00." Distribution 390 represents a distribution of threshold voltages of cells that are in a third programmed state, storing "01." Each of the two bits stored in a single memory cell, in this example, is from a different logical page. That is, each bit of the two bits stored in each memory cell carries a different logical page address. The bit displayed in the square corresponds to a lower page. The bit displayed in the circle corresponds to an upper page. In one embodiment, the logical states are assigned to the sequential physical states of memory cells using a gray code sequence so that if the threshold voltage of a floating gate erroneously shifts to its nearest neighboring threshold voltage state range, only one bit will be affected. In order to provide improved reliability, it is preferable for the individual distributions to be tightened (distribution narrowed), because the tighter distribution brings a wider read margin (distance between adjacent state threshold distributions).

Figure 11:
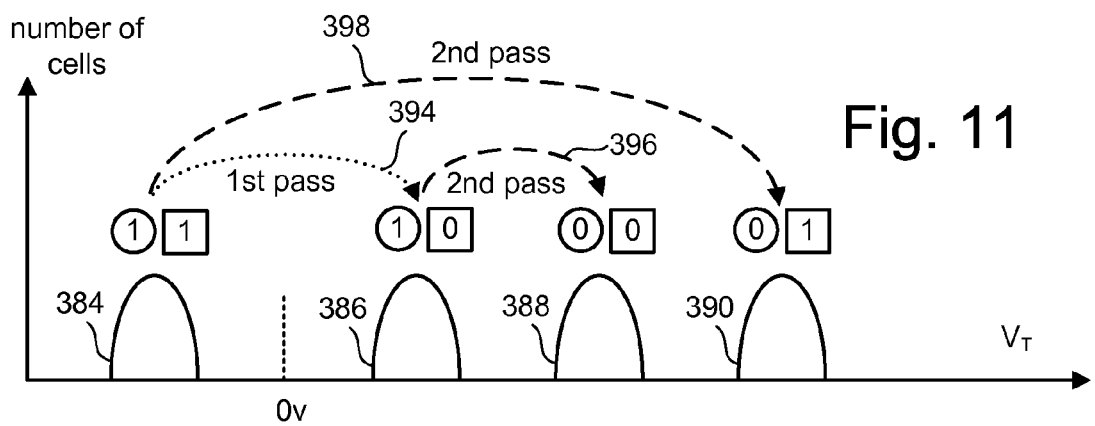
FIG. 11 depicts exemplary threshold distributions of a group of memory cells and an exemplary process for programming multi-state memory cells.

FIG. 11 illustrates an example of a two pass technique of programming a 4-state NAND memory cell such as a memory cell of the array whose threshold voltage distributions are illustrated in FIG. 10. In a first programming pass, the cell's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the cell is increased to be within threshold voltage distribution 386, as shown by arrow 394. That concludes the first programming pass.

In a second programming pass, the cell's threshold voltage level is set according to the bit being programmed into the upper logical page in conjunction with the existing logic level established by the first programming pass. If the upper logical page bit is to store a logic "1," then no programming occurs since the cell is in one of the physical states corresponding to threshold voltage distributions 384 or 386, depending upon the programming of the lower page bit, both of which carry an upper page bit of "1." If the upper page bit is to be a logic "0," however, the cell is programmed a second time. If the first pass resulted in the cell remaining in the erased state corresponding to threshold distribution 384, then in the second phase the cell is programmed so that the threshold voltage is increased to be within threshold distribution 390, as shown by arrow 398. If the cell had been programmed into the state corresponding to threshold distribution 386 as a result of the first programming pass, then the memory cell is further programmed in the second pass so that the threshold voltage is increased to be within threshold voltage distribution 388, as depicted by arrow 396. The result of the second pass is to program the cell into the state designated to store a logic "0" for the upper page without changing the logical state of the first programming pass.

Of course, if the memory is operated with more than four physical states then there will be a number of threshold voltage distributions within the defined voltage threshold window of the memory cells that is equal to the number of states. Further, although specific bit patterns have been assigned to each of the distributions or physical states, different bit patterns may be so assigned, in which case the states between which programming occurs can be different than those depicted in FIGS. 9-11.

Figure 1:
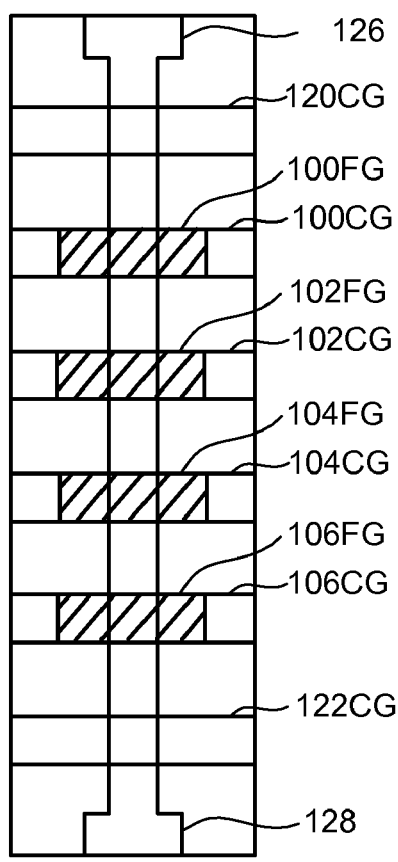
FIG. 1 is a top view of a NAND string.
Figure 2:
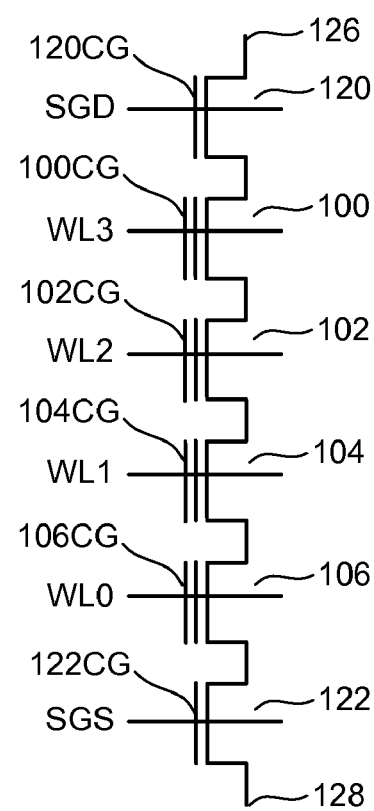
FIG. 2 is an equivalent circuit diagram of the NAND string depicted in FIG. 1.
Figure 3:
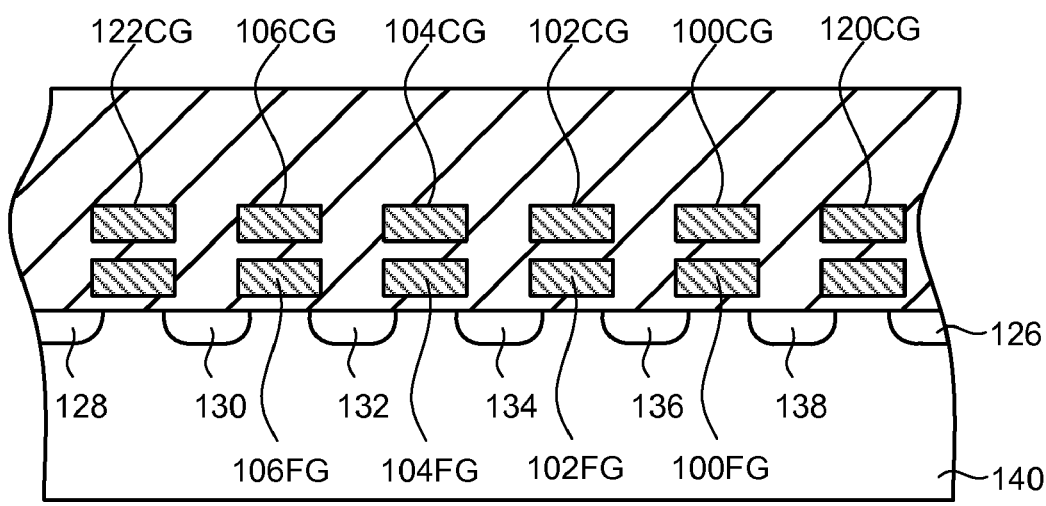
FIG. 3 is a cross sectional view of the NAND string of FIG. 1.
Figure 4:
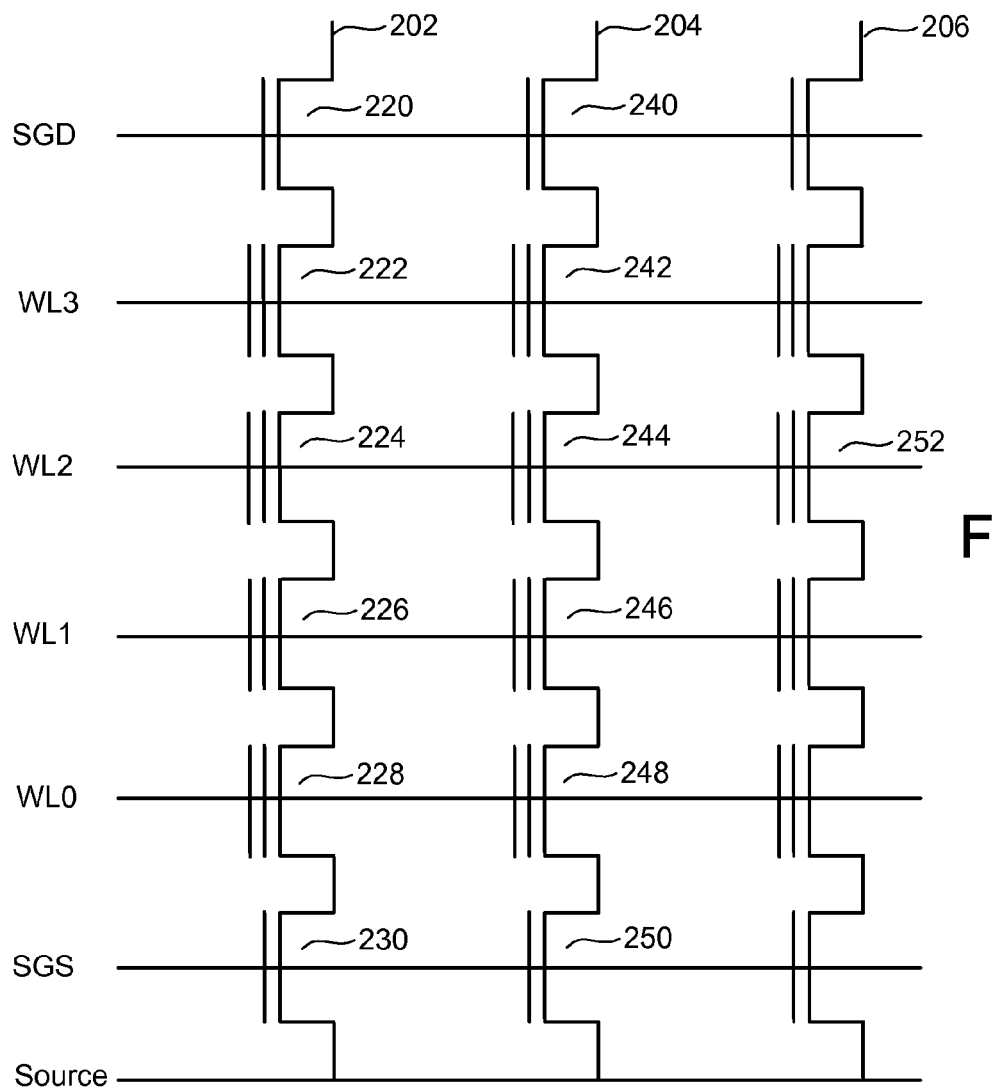
FIG. 4 is a circuit diagram depicting three NAND strings.

Normally, the cells being programmed in parallel are alternate ones along a word line. For example, FIG. 4 illustrates three memory cells 224, 244 and 252 of a much larger number of cells along one word line WL2. One set of alternate cells, including cells 224 and 252, store bits from logical pages 0 and 1 ("even pages or even columns"), while another set of alternate cells, including the cell 244, store bits from logical pages 2 and 3 ("odd pages or odd columns").

As described above, each iteration of step 360 of FIG. 8 includes the application of a programming voltage such as a pulse (Vpgm). A program voltage is applied to the control gate of a memory cell selected for programming by applying the program voltage to the appropriate word line. As previously discussed, a common word line architecture creates the potential to inadvertently program unselected memory cells or otherwise cause program disturb during programming. For example, when programming memory cell 224 of FIG. 4, a program voltage is also applied to memory cell 244 because it is also connected to WL2. The channel of a NAND string containing a memory cell not to be programmed but connected to a word line selected for programming (an addressed but not selected memory cell) is typically boosted above a minimum level to ensure program disturb below a predetermined level.

Various boosting or program inhibit schemes can be used to eliminate or minimize program disturb. In accordance with embodiments, multiple program inhibit schemes are used within a single non-volatile storage system to minimize the occurrence of program disturb. It has been discovered that certain program inhibit schemes work better at certain word lines than others. Because of this, one embodiment includes selecting a program inhibit scheme based on the word line that is being programmed. Various numbers of program inhibit schemes and partitions of the word lines into ranges for application of a certain scheme are used.

Figure 12:
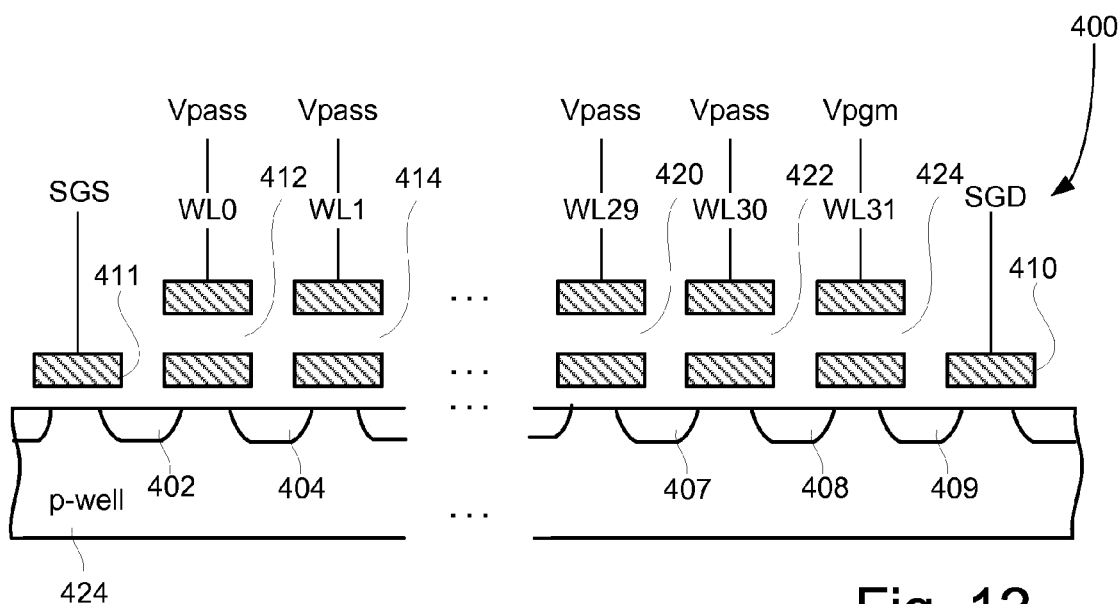
FIG. 12 depicts a cross section of an exemplary NAND string and a self-boosting program inhibit scheme.

One common program inhibit scheme is referred to as self-boosting. FIG. 12 depicts the biasing of a NAND string 400 which contains a memory cell to be inhibited during a program process. In FIG. 12, select memory cells connected to word line WL31 on other NAND strings are being programmed. Accordingly, Vpgm is being applied to WL31 and the memory cell coupled to WL31 in NAND string 400 is to be inhibited from programming. The principle of self-boosting relies on a boosted channel and source/drain region to reduce or eliminate program disturb. A voltage Vpass is applied to each unselected word line in the NAND string. At the same time, the bit line of NAND string 400 is driven with Vdd to inhibit programming. The Vpass voltage (e.g., 7-10 volts) will couple to the channel and source/drain regions of the NAND string corresponding to the unselected bit line, and cause a boosted voltage to be impressed in the channel region of the memory cell at WL31 as well as the source/drain regions 402, 404, 407, 408, 409, etc. of the NAND string. The boosted voltage in the channel lowers the electric field across the tunnel oxide of memory cell 424 and thus, reduces the potential for inadvertent programming.

As previously discussed, a block of memory cells is typically programmed in sequence from the source side to the drain side, for example, from WL0 to WL31. A typical programming sequence may involve programming one or more pages of a first word line and then programming one or more pages of the neighboring word line to the drain side and so on until the memory cells of each word line have been programmed. When the programming process is ready to program the memory cells of the last (or near the last) word line of the NAND string, if all or many of the previously programmed cells (e.g., memory cells 412, 414, 420, and 422 as well as others not shown) on the string being inhibited were programmed, a negative charge is present in the floating gates of those previously programmed cells. Because of this negative charge on the floating gates, the boosted potential may not get high enough and there may be program disturb on the last (or near the last) word lines. This may limit the boosting level in the channel of NAND string 400 and possibly allow program disturb of memory cell 424.

Figure 13:
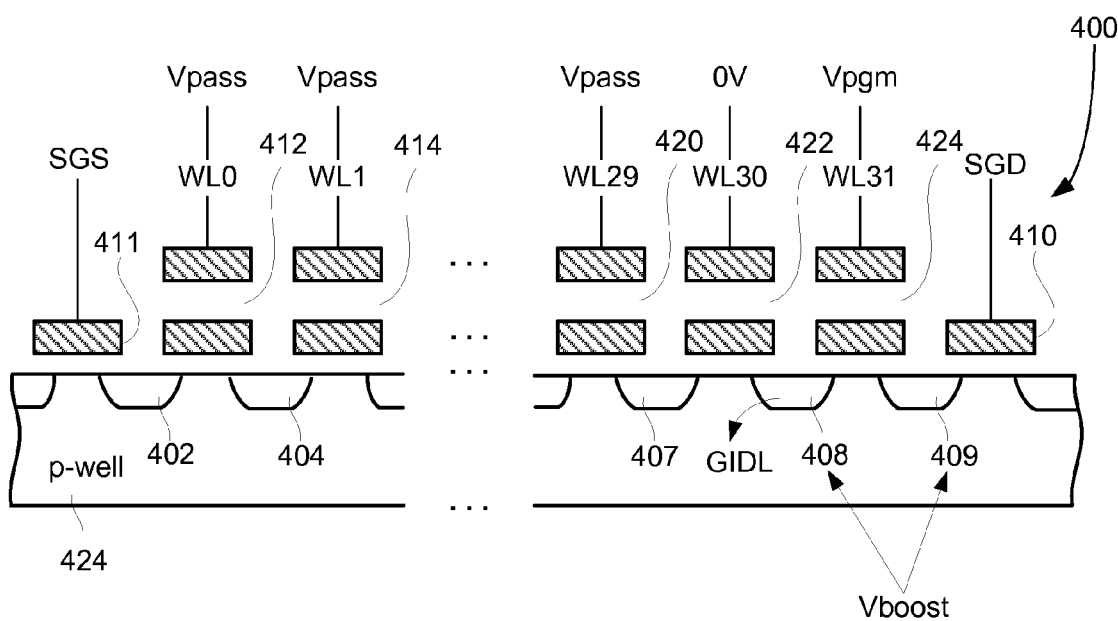
FIG. 13 depicts a cross section of an exemplary NAND string and an erased area self-boosting program inhibit scheme.

Another self-boosting technique is erased area self-boosting (EASB) which attempts to isolate the channel of previously programmed cells from the channel of the cell being inhibited. FIG. 13 depicts the biasing of an exemplary NAND string using EASB. The source side neighboring word line, word line WL30 in this example, is set to a low voltage (for example 0V), while the remaining non-selected word lines (WL0-WL29) are set to Vpass. In one embodiment, Vpass is between 7-10 volts. The value of Vpass is constrained by considerations of boosting and disturb. A large enough value should be chosen so that boosting in the channel is sufficient to prevent program disturb. However, a low enough value should be chosen so that unselected word lines are not inadvertently programmed (off-row disturb).

EASB can present problems dependent upon on the programmed state of the source side neighboring memory cell. If the source side neighbor cell is programmed, there is a negative charge at that cell. When 0 volts are applied to the control gate, there is a highly reverse biased junction under the negatively charged gate which can cause Gate Induced Drain Leakage (GIDL). GIDL involves electrons leaking into the boosted channel. GIDL occurs with a large bias in the junction and a low or negative gate voltage, which is precisely the case when the source side neighbor cell is programmed and the drain junction is boosted. GIDL can cause the boosted voltage to leak away prematurely, resulting in a programming error. GIDL is more severe with an abruptly and highly doped junction required as cell dimensions are scaled. If the leakage current is high enough, the boosting potential in the channel region will go down and there can be program disturb.

If the source side neighbor memory cell is erased, then there is positive charge on the floating gate and the threshold voltage of the transistor will likely be negative. The transistor may not turn off (or may turn off later when the channel under the lower word lines has been sufficiently boosted) even when zero volts is applied to the word line. If the memory cell is on, then the NAND string is not operating in EASB mode. Rather that string is operating in self boosting mode, and self boosting mode has the problems discussed above.

It has been discovered that the problems associated with erased area self-boosting are more pronounced when programming higher (later programmed) word lines. An increase in GIDL is seen as higher word lines are programmed. Despite the increased GIDL at higher word lines, however, EASB demonstrates more effective program inhibit capability at higher word lines than a traditional self-boosting scheme.

Figure 14:
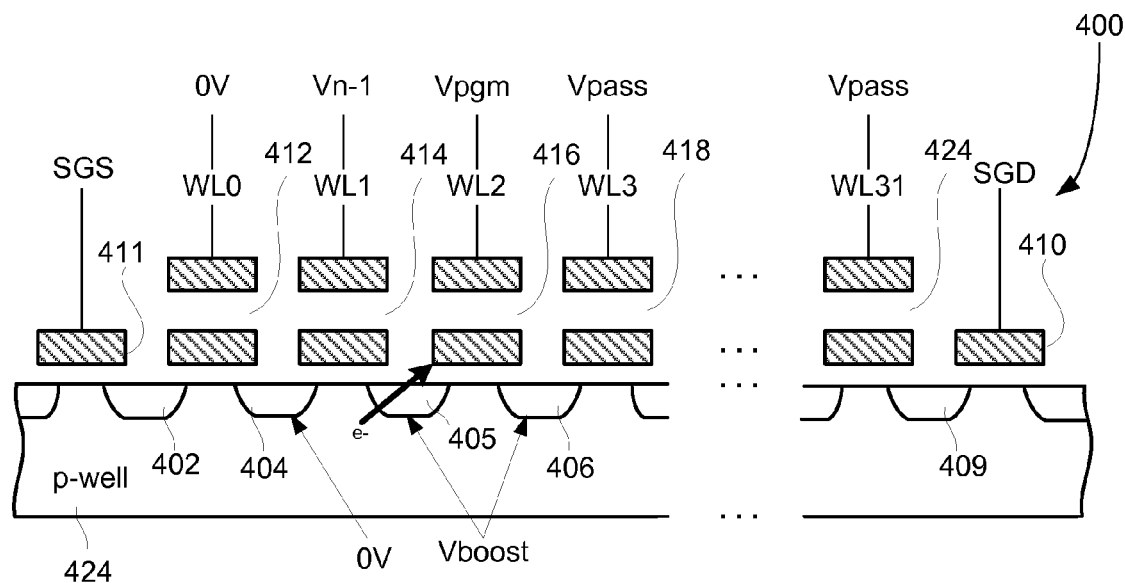
FIG. 14 depicts a cross section of an exemplary NAND string and a revised erased area self-boosting program inhibit scheme.

In revised erased area self-boosting (REASB), a gradual decrease in the source side word line voltages to 0V is applied during boosting rather than applying 0V to the immediate source neighbor. REASB has been discovered to work well at higher word lines to avoid program disturb. However, REASB has also been discovered to not work as well at lower word lines. FIG. 14 depicts a NAND string having a memory cell at word line WL2 that is to be inhibited from programming. Vpgm is applied at WL2. Vn−1 is applied to the immediate source side neighbor at word line WL1. Various values can be used for Vn−1. Vn−1 is lower than Vpgm or Vpass but higher than 0V so that a gradual decrease to 0V is created. In one embodiment Vn−1 is equal to Vdd. More than one step down voltage such as Vn−1 can be used. For example, Vn−1 could be applied to the immediate source side neighbor 414 and Vn−2 (lower than Vn−1) could be applied to the next source side neighbor 412. In the embodiment of FIG. 14, 0V is applied to WL0 to isolate the region around WL2.

Figure 15:
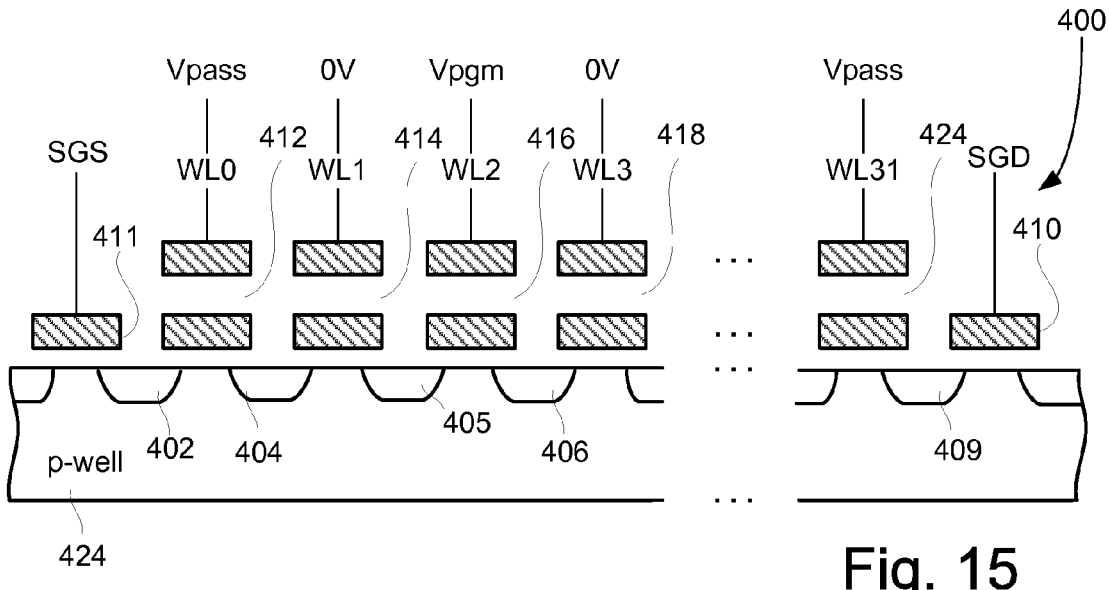
FIG. 15 depicts a cross section of an exemplary NAND string and a localized self-boosting program inhibit scheme.

Local Self Boosting (LSB) is similar to EASB except that both the source and drain side neighbors are set to 0V for the inhibit scheme. FIG. 15 depicts the biasing of a NAND string using the LSB scheme. As illustrated, memory cells of WL2 are being programmed. Vpgm is supplied to WL2 while 0V are supplied to the neighboring source side line WL1 and the neighboring drain side line WL3. The application of 0V to both neighboring word lines will further isolate the region surrounding memory cell 416. However, applying 0V to the drain side word line as well can decrease the boosted voltage of the channel. To increase the boosted levels, a revised local self-boosting (RLSB) technique similar to that of REASB can be used. The immediate drain and source side word lines (e.g., lines WL1 and WL3) are supplied an intermediate voltage, Vn−1, which can be Vdd in one embodiment. The next drain and source side neighboring lines are provided 0V and the remaining unselected word lines, Vpass.

Recognizing the benefits and drawbacks of these various program inhibit schemes, it is proposed to selectively choose a program inhibit scheme based on the particular word line being programmed. SB has been shown to be better at lower word lines than higher ones. EASB and REASB, on the other hand, have been shown to be better at higher word lines than lower ones, with REASB demonstrating further improvements as described.

FIG. 16 depicts, by way of non-limiting example, a table of various options for applying select program inhibit schemes based on the word line being programmed. Although these options are demonstrated with respect to a 32 memory cell NAND string, it will be appreciated that embodiments are not so limited. In the first method, the word lines are divided into two regions. In the first region from WL0 to WLn−1, a first program inhibit scheme is applied for a NAND string of an inhibited memory cell when programming a selected word line. In the second region from WLn to WL31, a second program inhibit scheme is applied. In one embodiment, the first program inhibit scheme PIS1 is a self-boosting scheme and the second program inhibit scheme PIS2 is an erased area self-boosting scheme or a revised erased area self-boosting scheme. By utilizing self-boosting on the word lines from WL0 to WLn−1, the problems identified with self-boosting at higher word lines are minimized. Likewise, by utilizing REASB on word lines WLn+1 to WL31, the problems with REASB at lower word lines are minimized. In one embodiment the number of word lines that are programmed using the PIS1 scheme (e.g., SB) is four and the number of word lines programmed using the PIS2 scheme is 28. In other embodiments, other ranges of word lines can be used.

As the second method in FIG. 16 demonstrates, the number of different program inhibit schemes that can be applied based on word line is not limited to two. In the second method, the word lines are divided into three regions. In the first region from WL0-WLn−1, a first program inhibit scheme PIS1 is applied. In a second region form WLn to WLm−1, a second program inhibit scheme PIS2 is applied. In a third region form WLm to WL31, a third program inhibit scheme PIS3 is applied. In one embodiment PIS1 is a self-boosting scheme, PIS2 is an erased area or revised erased area self-boosting scheme, and PIS3 is a revised erased area self-boosting scheme. In one embodiment, the number of word lines programmed using the PIS1 scheme is four, the number programmed using the PIS2 scheme is eight, and the number programmed using the PIS3 scheme is 20. As with the first method, various ranges of word lines can be used.

The third method of FIG. 16 demonstrates that any number of program inhibit schemes can be applied dependent on the word line being programmed. In the third method, a different program inhibit scheme is utilized for each word line of the NAND string.

It has also been discovered that the rate of increase in the program voltage pulse can be manipulated to minimize the program disturb on unselected memory cells coupled to the word line being programmed. As FIG. 7 illustrates, there is some slope to the program voltage pulses applied to a selected word line during programming. A correlation between program disturb and the slope of the program voltage pulse has been discovered. Moreover, it has been discovered that program disturb effects due to the slope are greater on the lower word lines which are programmed earlier.

Accordingly, it is proposed to select a program voltage pulse slope or ramp rate based on the word line being programmed. FIG. 17 depicts two program voltage pulse signals. Signal 502 represents one pulse of a signal as depicted in FIG. 7. A relatively sharp or fast program voltage pulse ramp rate is seen on pulse 502. Signal 504 represents another pulse with a more gentle slope or slower ramp rate. By applying the program voltage pulse with the slower ramp rate to lower word lines, the amount of program disturb can be decreased. The election to utilize the slower rate on only the lower word lines can improve performance. The higher word lines exhibit a smaller amount of disturb attributable to the program voltage ramp rate. Numerous ranges of word lines can be selected for the slower ramp rate signal to be applied to. Additionally, a number of varying ramp rate signals can be used.

FIG. 18 includes three various options for selecting a program voltage ramp rate dependent on the word line being programmed. In the first method, the word lines are divided into two ranges and a first program voltage pulse ramp rate PPR1 is applied while programming a word line in the first range (WL0-WLn-1) and a second program voltage pulse ramp rate PPR2 is applied while programming a world line in the second range (WLn-WL31). PPR1 can include a slower ramp rate than PPR2 so that program disturb of the memory cells on the lower word lines in the first range is minimized.

Methods 2 and 3 demonstrate that more than two ramp rates can be used. In method 2, a first ramp rate PPR1 is used for word lines WL0-WLn-1, a second ramp rate for word lines WLn-WLm-1, and a third ramp rate for word lines WLm-WL31. PPR1 can be slower than PPR2 and PPR2 slower than PPR3. Such a scheme can minimize program disturb while maintaining performance of the memory system. In method 3, a different ramp rate for each word line can be used. In one embodiment, the ramp rate increases with each higher word line.

The use of different program voltage pulse ramp rates can be combined with the use of various program inhibit schemes. For example, method 1 of FIG. 16 and method 1 of FIG. 18 can be combined such that the program inhibit scheme actually includes the application of a select program voltage pulse ramp rate. If these methods are combined, the slower ramp rate PPR1 can be used with PISI (e.g., self-boosting) when programming word lines WL0-WLn-1. The faster ramp rate PPR2 can be used with PIS2 (e.g., REASB) when programming word lines WLn-WL31. Numerous combinations and variations of the methods depicted in FIGS. 16 and 18 can be used in accordance with embodiments.

Figure 19:
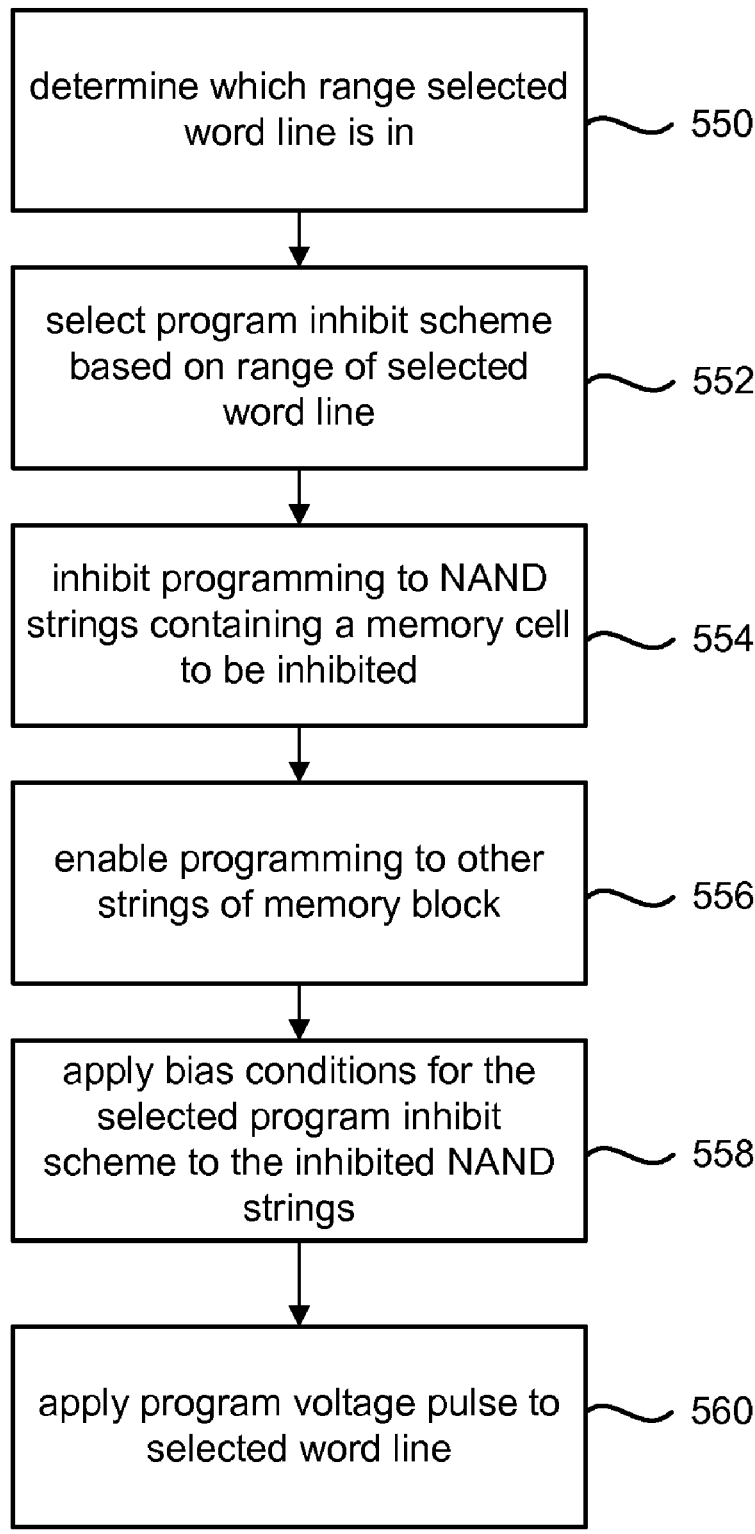
FIG. 19 is a flowchart in accordance with one embodiment for utilizing different program inhibit schemes based on the word line being programmed.

FIG. 19 is a flowchart in accordance with one embodiment for programming a block of memory cells. In one embodiment, the method depicted in FIG. 19 is performed at step 360 of FIG. 8. Each time a program voltage pulse is applied, the method of FIG. 19 can be performed to boost the channel voltage potential in unselected NAND strings to minimize the occurrence of program disturb.

FIG. 19 begins at step 550 where a determination is made as to what range of word lines of the selected memory block the selected word line having a program voltage signal applied thereto is in. Referring to FIG. 16 for example, step 550 may determine if the selected word line is the range from WL0-WLn-1 or WLn-WL31. In other embodiments more ranges are used (e.g., method 2 of FIG. 16) so step 550 will comprise determining which range from the plurality of ranges the selected word line is in. In one embodiment, each word line is its own range such that a different scheme is applied to each word line.

After determining the range of the word line, the corresponding program inhibit scheme can be selected. In method 1 of FIG. 16, scheme PIS1 is selected if the word line is between WL0 and WLn-1 and scheme PSI2 is selected if the word line is between WLn and WL31. If more ranges are used, more schemes can be used and the selection will be from the increased number of schemes. In one embodiment, a select scheme for each individual word line is selected. Selecting a program inhibit scheme can include selecting a program voltage pulse ramp rate. In one embodiment, the ramp rate is chosen in addition to the particular bias conditions for a program inhibit scheme.

Programming to strings containing a memory cell to be inhibited is inhibited at step 554. For example, the bit line of those strings can be raised to Vdd to inhibit programming. At step 556, the bit lines of each NAND string having a memory cell that is to be programmed during the next pulse are set to 0V to enable programming. The bias conditions for the selected program inhibit scheme (step 552) are applied at step 558. For example, if EASB is being used, the source side neighboring word line can have 0V applied thereto and the remaining unselected word lines have Vpass applied. In one embodiment, setting up the bias conditions at step 558 is performed simultaneously with step 554 and/or step 556. At step 560, the program voltage signal Vpgm pulse is applied to the selected word line to program the memory cells of the enabled bit lines. In some embodiments, step 560 includes applying the program voltage pulse having a ramp rate selected at step 552.

It has also been discovered that temperature plays a role in the efficacy of program inhibit schemes. Some schemes have been found to work better at higher temperatures while others have been found to work better at lower temperatures. In one embodiment, the temperature of a non-volatile storage system is used to select an appropriate program inhibit scheme while programming. A temperature sensor 317 is provided with the non-volatile memory system (FIG. 5) and can sense the temperature before or during the program operation. The state machine 316 can receive the temperature data from sensor 317 and cause a corresponding program inhibit scheme to be applied to the selected memory block.

Figure 20:
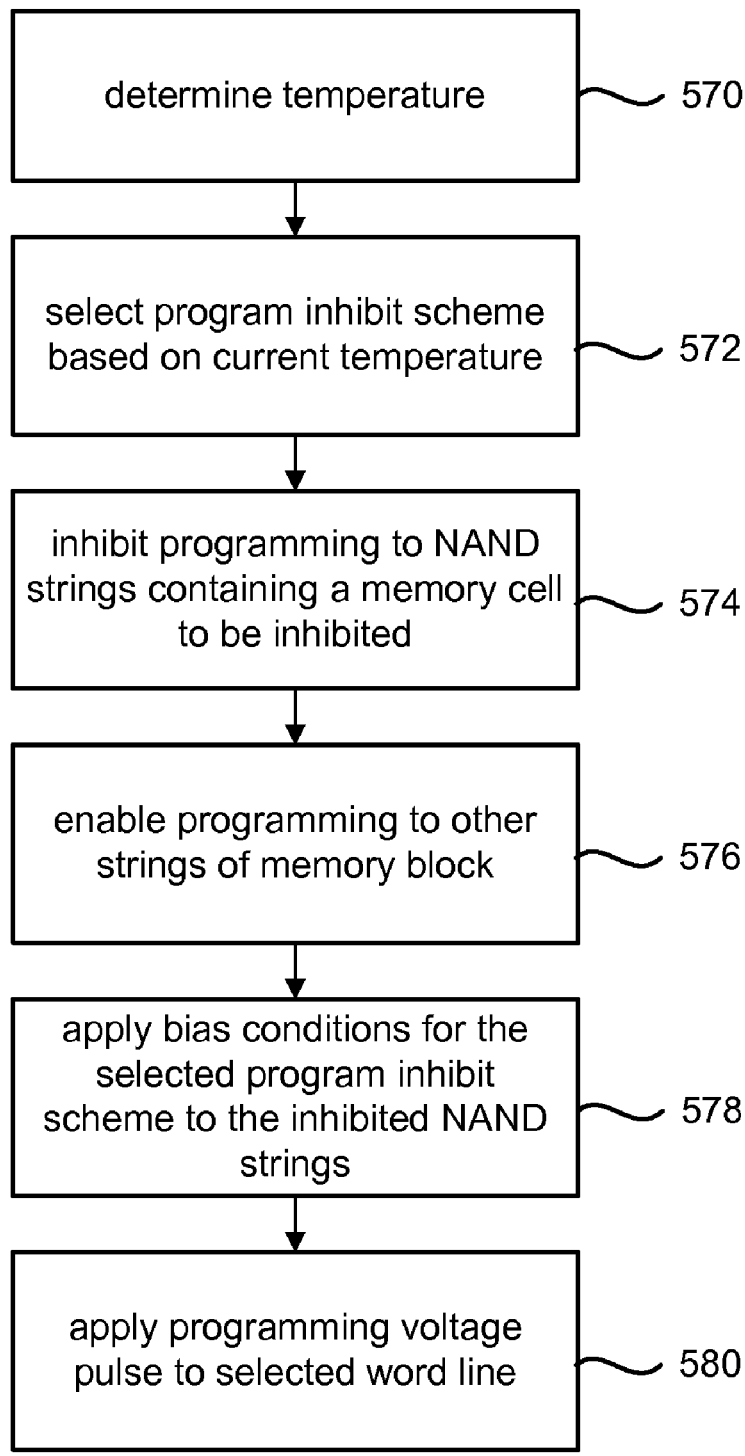
FIG. 20 is a flowchart in accordance with one embodiment for utilizing different program inhibit schemes based on the temperature of the memory system.

FIG. 20 is a flowchart in accordance with one embodiment for using temperature to select a particular program inhibit scheme. Like FIG. 19, the method of FIG. 20 can be used during the application of a program voltage pulse at step 360 of FIG. 8. At step 570, the temperature sensor senses the temperature of the storage system. At step 572, a program inhibit scheme is selected based at least in part on the sensed temperature. For example, it has been found that self-boosting works better at high temperatures while erased area self-boosting and revised erased area self-boosting work better at low temperatures. Thus, in one embodiment a breakpoint temperature is provided. If the sensed temperature is above the breakpoint, self-boosting is selected at step 572. If the sensed temperature is below the breakpoint, revised erased area self-boosting is applied. Other variations can be used including but not limited to using more than two schemes and thus, more than two breakpoint levels. Other schemes besides SB and REASB can be used as well.

At step 574, the NAND strings having a memory cell to be inhibited are inhibited from programming by raising the bit line voltage of those strings. At step 576, programming is enabled for the NAND strings having memory cells to be programmed by applying 0 volts to those bit lines. At step 578, the bias conditions for the selected inhibit scheme are applied. In one embodiment, steps 574 and 576 are performed simultaneously. In one embodiment, these steps are performed as part of step 578. After applying the bias conditions, the program voltage pulse is applied to the selected word line at step 580.

The above examples are provided with respect to NAND type flash memory. However, the principles of the present invention have application to other types of non-volatile memories which utilize boosting, including those currently existing and those contemplated to use new technology being developed.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method of programming non-volatile storage, comprising:
    determining which of a plurality of word lines is to receive a program voltage signal for programming, said word line is coupled to a first non-volatile storage element of a first group of non-volatile storage elements and a second non-volatile storage element of a second group of non-volatile storage elements, said first non-volatile storage element is to be inhibited from programming and said second non-volatile storage element is to be programmed; and
    selecting a ramp rate for one or more pulses of said program voltage signal based on said word line that is to receive said program voltage signal.

2. The method of claim 1, wherein selecting a ramp rate comprises:
    selecting a first ramp rate for said one or more pulses if said word line is in a first range of said plurality of word lines or a second ramp rate if said word line is in a second range of said plurality of word lines.

3. The method of claim 2, wherein:
    said first range of word lines is programmed prior to said second range of word lines; and
    said first ramp rate is slower than said second ramp rate.

4. The method of claim 1, wherein selecting a ramp rate for said one or more pulses comprises:
    selecting a slope for said one or more pulses.

5. The method of claim 1, further comprising:
    selecting a program inhibit scheme based on said word line that is to receive said program voltage signal.

6. The method of claim 5, further comprising:
    boosting a voltage potential of a channel of said first group of non-volatile storage elements using said selected program inhibit scheme; and
    enabling programming of said second group of non-volatile storage elements.

7. The method of claim 6, wherein selecting said program inhibit scheme is based on an order of programming and includes:
    determining whether said word line that is to receive said program voltage signal is in a first range or a second range of said plurality of word lines, said first range is programmed prior to said second range; and
    selecting a first program inhibit scheme if said word line is in said first range and a selecting a second program inhibit scheme if said word line is in said second range.

8. The method of claim 7, wherein:
    said first program inhibit scheme is a self-boosting program inhibit scheme; and
    said second program inhibit scheme is an erased area self-boosting scheme.

9. The method of claim 1, wherein:
    said first group and said second group are part of an array of non-volatile storage elements;
    said array is in communication with a host system; and
    said array is removable from said host system.

10. The method of claim 1, wherein:
    said first group of non-volatile storage elements is a first NAND string; and
    said second group of non-volatile storage elements is a second NAND string.

11. A non-volatile memory system, comprising:
    a plurality of word lines;
    a first group of non-volatile storage elements having a first non-volatile storage element to be inhibited from programming;
    a second group of non-volatile storage elements having a second non-volatile storage element to be programmed; and
    managing circuitry in communication with said plurality of word lines and said first and second groups of non-volatile storage elements, said managing circuitry programs said second non-volatile storage element by:
        determining which word line of said plurality of word lines is coupled to said second non-volatile storage element, said word line is a first word line and is also coupled to said first non-volatile storage element, and
        selecting a ramp rate for pulses of said program voltage signal based on said first word line being selected for programming.

12. The non-volatile memory system of claim 11, wherein said managing circuitry programming said second non-volatile storage element further includes:
    selecting a program inhibit scheme based on said first word line being selected for programming;
    boosting a voltage potential of a channel of said first group of non-volatile storage elements using said selected program inhibit scheme; and
    enabling programming of said second group of non-volatile storage elements.

13. The non-volatile memory system of claim 11, wherein said managing circuitry selecting a ramp rate for pulses of said program voltage signal based on said first word line being selected for programming includes:
    selecting a first ramp rate for said pulses of said program voltage signal if said word line is in a first range of said plurality of word lines; and
    selecting a second ramp rate for said pulses of said program voltage signal if said word line is in a second range of said plurality of word lines.

14. The non-volatile memory system of claim 13, wherein:
said managing circuitry programs said first range of word lines prior to said second range; and
said first ramp rate is slower than said second ramp rate.

15. The non-volatile memory system of claim 11, wherein:
said managing circuitry includes at least one of a state machine and a controller.

16. The non-volatile memory system of claim 11, wherein:
said first group and said second group are part of an array of non-volatile storage elements;
said array is in communication with a host system; and
said array is embedded in said host system.

* * * * *